United States Patent [19]

Yagami et al.

[11] Patent Number: 5,317,558
[45] Date of Patent: May 31, 1994

[54] ELECTRONIC VOLUME VARYING APPARATUS RESTRICTED BY MUTING MODE

[75] Inventors: Heihachiro Yagami; Kazuhiro Kimizuka; Masahiro Odashima, all of Saitama, Japan

[73] Assignee: Pioneer Electronic Corporation, Tokyo, Japan

[21] Appl. No.: 889,145

[22] Filed: May 27, 1992

[30] Foreign Application Priority Data

Oct. 9, 1991 [JP] Japan ............................ 3-262069
Oct. 23, 1991 [JP] Japan ............................ 3-275363
Oct. 24, 1991 [JP] Japan ............................ 3-087213[U]

[51] Int. Cl.$^5$ ..................... H03G 3/02; G11B 9/00
[52] U.S. Cl. ................... 369/126; 381/104; 381/105; 381/107; 381/108
[58] Field of Search .......... 369/126; 381/104, 106, 381/105, 107, 108, 110

[56] References Cited

U.S. PATENT DOCUMENTS

| | | | |
|---|---|---|---|
| 4,349,779 | 9/1982 | Ono | 323/318 |
| 4,473,803 | 9/1984 | Kaneko et al. | 330/144 |
| 4,611,344 | 9/1986 | Hayama et al. | 381/108 |
| 4,706,294 | 11/1987 | Ouchida | 381/109 |
| 4,792,990 | 12/1988 | Beyers, Jr. | 381/107 |
| 5,010,577 | 4/1991 | Sakanishi et al. | 381/104 |
| 5,077,799 | 12/1991 | Cotton | 381/107 |
| 5,130,665 | 7/1992 | Walden | 381/107 |

FOREIGN PATENT DOCUMENTS 3102168 12/1981 Fed. Rep. of Germany .
3444770 4/1989 Fed. Rep. of Germany .

Primary Examiner—Constantine Hannaher
Assistant Examiner—Kim-Kwok Chu
Attorney, Agent, or Firm—Sughrue, Mion, Zinn, Macpeak & Seas

[57] ABSTRACT

An electronic volume varying apparatus for producing a controlling signal to control an electronic volume in response to pulses from a manually operable pulse generator, wherein it is prevented, when incorporated in a cassette deck or the like, that a listener is surprised with a great sound volume after cancellation of a muting mode. A muting judging section outputs a memory disabling signal when a muting-on signal is supplied thereto, and a memory enabling/disabling device is interposed between a pulse counting device and a memory device of a controlling section and stops its outputting of pulse count data from the pulse counting device to the memory device in response to the memory disabling signal from the muting judging section. A method and apparatus which can accurately detect an input pulse from a manually operable pulse generator as well as a pulse switch which eliminates inadvertent outputting of a pulse are also disclosed.

10 Claims, 13 Drawing Sheets

ELECTRONIC VOLUME VARYING APPARATUS RESTRICTED BY MUTING MODE

BACKGROUND OF THE INVENTION

1. Field of the Invention

This invention relates to an electronic volume varying apparatus which includes a controlling section for outputting a controlling signal to control an electronic volume in response to pulses from an operating section and also to an input pulse detecting method for processing or ignoring a chattering portion which appears at a trailing end of an input pulse from an operating section to detect the input pulse as well as a pulse switch apparatus to which the input pulse detecting method can be applied suitably.

2. Description of the Prior Art

Electronic volume varying apparatus which include a controlling section for outputting a controlling signal to control an electronic volume in response to pulses from an operating section are already known. An exemplary one of such conventional electronic volume varying apparatus is shown in FIG. 8.

Referring to FIG. 8, the electronic volume varying apparatus shown includes a rotary pulse generator 1 serving as an operating section. The rotary pulse generator 1 has such construction as shown in FIG. 9 and outputs an output pulse or pulses in accordance with a direction of rotation thereof. In particular, the rotary pulse generator 1 outputs an up pulse or pulses $P_U$ when it rotates in one direction but outputs a down pulse or pulses $P_D$ when it rotates in the opposite direction.

The electronic volume varying apparatus further includes a controlling section 2. The controlling section 2 includes a pulse inputting device 21 for outputting either an up pulse confirmation signal $P_{US}$ representative of confirmation of an up pulse $P_U$ from the rotary pulse generator 1 or a down pulse confirmation signal $P_{DS}$ representative of confirmation of a down pulse $P_D$ from the rotary pulse generator 1. A pulse counting device 22 outputs either up pulse count data $D_U$ representative of a count value of up pulse confirmation signals $P_{US}$ received from the pulse inputting device 21 or down pulse count data $D_D$ representative of a count value of down pulse confirmation signals $P_{DS}$ received from the pulse inputting device 21. A memory device 23 stores therein up pulse count data $D_U$ or down pulse count data DD received from the pulse counting device 22, and an arithmetic unit 24 calculates control data $D_C$ for controlling an electronic volume 3 in accordance with count data $D_1$ or $D_D$ recalled from the memory device 23 and outputting the control data $D_C$ to the memory device 23 and sends the control data $D_C$ to the memory device 23 so that they are stored into the memory device 23. A data outputting device 25 outputs a controlling signal $S_C$ in accordance with control data $D_C$ recalled from the memory device 23 to the electronic volume 3.

The electronic volume 3 attenuates a sound volume signal $S_A$ supplied from an external circuit not shown in accordance with the controlling signal $S_C$ received from the data outputting device 25 of the controlling section 2 and outputs an attenuation signal $S_{AA}$ obtained by the attenuation.

An amplifier 4 amplifies the attenuation signal $S_{AA}$ received from the electronic volume 3 and supplies it to a loudspeaker 5.

In operation, when an up pulse $P_U$ is outputted from the rotary pulse generator 1, the pulse inputting device 21 outputs an up pulse confirmation signal $P_{US}$. The pulse counting device 22 counts the up pulse confirmation signal $P_{US}$ and outputs up pulse count data $D_U$. Consequently, the memory device 23 stores therein the up pulse count data $D_U$.

The arithmetic unit 24 calculates control data $D_C$ in accordance with the up pulse count data $D_U$ of the memory device 23 and stores them back into the memory device 23. The data outputting device 25 recalls the control data $D_C$, produces a controlling signal $S_C$ in accordance with the control data $D_C$ and outputs the controlling signal $S_C$ therefrom.

The electronic volume 3 attenuates a sound volume signal $S_A$ supplied thereto from the external circuit in accordance with the controlling signal $S_C$ and outputs an attenuation signal $S_{AA}$ obtained by the attenuation. The attenuation signal $S_{AA}$ is amplified by the amplifier 4 and sent to the loudspeaker 5. Consequently, sound the volume of which is adjusted in accordance with the attenuation signal $S_{AA}$ is generated from the loudspeaker 5.

It is to be noted that, when a down pulse $P_D$ is outputted from the rotary pulse generator 1, the controlling section 2, electronic volume 3 and amplifier 4 operate in a similar manner so that sound the volume of which is, in this instance, decreased in accordance with the attenuation signal $S_{AA}$ is generated from the loudspeaker 5.

The conventional electronic volume varying apparatus is constructed in such a manner as described above, and since the rotary pulse generator 1 does not have a position indication representative of a turning position of a manually operable knob or dial, a set condition of the electronic volume 3 cannot be discriminated.

Further, though not shown, the conventional electronic volume varying apparatus is constructed such that the electronic volume 3 is controlled in response to an up pulse PU or a down pulse PD generated from the rotary pulse generator 1 independently of a muting operation.

Accordingly, when the electronic volume varying apparatus is applied, for example, to a cassette deck which is constructed such that it enters a muting mode when it is put into a fast feeding (FF) mode or a rewinding (REW) mode, if the rotary pulse generator 1 is rotated in the up direction in a muting mode of the cassette deck, then the sound volume increases suddenly immediately after cancellation of the muting mode. Consequently, a listener may be surprised by the great sound volume.

The rotary pulse generator described above has such a construction as shown, for example, in FIG. 9. Referring to FIG. 9, the rotary pulse generator shown includes a fastening plate 101 having an elliptic hole 101a formed at a central portion thereof. An elliptic portion of a shaft 107 is fitted in the elliptic hole 101a of the fastening plate 101 as shown in FIG. 10. The fastening plate 101 further has a pair of fitting fingers 101b formed thereon across the elliptic hole 101a such that they extend in an axial direction of the elliptic hole 101a.

The rotary pulse generator further includes a spacer 102 having a hole 102a formed at a central portion thereof. The fitting pieces 101b of the fastening plate 101 extend through the hole 102a of the spacer 102.

The rotary pulse generator further includes a movable contact plate 103 mounted for integral rotation with the fastening plate 101 and the shaft 107. The movable contact plate 103 includes a movable plate 103a having a hub $103a_1$ which has a bore $103a_{11}$ formed therein. The fitting fingers 101b of the fastening plate 101 and the shaft 107 are fitted in the bore $103a_{11}$ of the hub $103a_1$ of the movable contact plate 103 such that, when the shaft 107 is manually rotated, it rotates the fastening plate 101 and the movable contact plate 103 together therewith. The movable contact late 103 further has a contact plate 103b having conducting portions $103b_1$ and non-conducting portions $103b_2$ provided alternately at a suitably spaced relationship, for example, in an equidistantly spaced relationship, on a common circle around the hub $103a_1$ of the movable plate 103a.

The rotary pulse generator further includes a ball 104 made of a conducting material and mounted such that it rolls on the conducting portions $103b_1$ and non-conducting portions $103b_2$ of the contact plate 103b.

The rotary pulse generator further includes an insulating casing 105 having a ball box 5a provided thereon for holding the ball 104 for rolling movement thereon. A common terminal 106A is mounted on the insulating casing 105 such that it is noramlly held in contact with the contact plate 103b, and first and second terminals 106B and 106C are mounted on the insulating casing 105 such that the first terminal 106B is contacted with the ball 104 when the contact plate 103b is rotated in a first direction (up direction) but the second terminal 106C is contacted with the ball 104 when the contact plate 103b are rotated in a second direction (down direction) opposite to the first direction.

When the components 101 to 107 are assembled in position, the ball 104 contacts with a contacting portion $103b_1$ of the movable contact plate 103 and also with the first terminal 106B so that it is held from movement in the leftward direction as shown, for example, in FIGS. 10 and 11a.

In this condition, if the shaft 107 is rotated in the counterclockwise direction, that is, first or up direction, then the fastening plate 101 and the movable contact plate 103 are rotated in the same direction by the shaft 107. During such counterclockwise rotation, the ball 104 is alternately contacted with the conducting portions $103b_1$ and the non-conducting portions $103b_2$ so that such up pulses $P_u$ as shown by a curve (a) in FIG. 12 are generated between the common terminal 106A and the first terminal 106B.

Then, if the rotation of the shaft 107 is stopped at a point of time $t_1$, then generation of such up pulses $P_u$ is stopped in a condition wherein an up pulse $P_u$ rises.

Then, if the shaft 107 is rotated further in the counterclockwise direction from its stopped position from a point of time $t_2$ after lapse of a predetermined interval of time, then the pulse $P_u$ then falls as indicated by a solid line of the curve (a) in FIG. 12 and further up pulses $P_U$ are generated as indicated by a broken line of the curve (a) in FIG. 12 between the common terminal 106A and the first terminal 106B.

On the contrary, if the shaft 107 is rotated in the opposite, clockwise direction, that is, second or down direction, from the point of time $t_2$, then the fastening plate 101 and the movable contact plate 103 are rotated by the shaft 107. Thereupon, the ball 104 is spaced away from the first terminal 106B and now brought into contact with the second terminal 106C as seen from FIG. 11b. Thus, the last up pulse $P^U$ falls as indicated by the solid line portion of the curve (a) in FIG. 12 when the ball 104 is spaced away from the first terminal 106B, and after then, down pulses $P_D$ are generated as seen from another curve (b) in FIG. 12 after the ball 104 is contacted with the second terminal 106C.

Since the conventional rotary pulse generator is constructed in such a manner as described above, when the shaft 107 is stopped at a normal position at which the ball 104 contacts with a conducting portion $103b_1$ of the movable contact plate 103, a pulse $P^U$ or $P_D$ is generated as described above.

However, due to the structure of the rotary pulse generator, when the shaft 107 is rotated in the counterclockwise direction in FIG. 10 and then stopped, it sometimes stops at a position at which the ball 104 is displaced any conducting portion $103b_1$ but contacts with a non-conducting portion $103b_2$ of the contact plate 103 as shown in FIG. 11c.

If the shaft 107 is rotated in the clockwise direction in this condition, then the ball 104 will be contacted, when the movable contact plate 103 is rotated, with a conducting portion $103b_1$ before it is spaced away from the first terminal 106B. Consequently, down pulses $P_D$ will be generated as seen from a curve (b) in FIG. 13 after an up pulse $P_U$ is generated as seen from another curve (a) in FIG. 13.

Although detailed description is omitted, also when the shaft 107 is rotated in the counterclockwise direction, a similar situation may occur.

Accordingly, although the shaft 107 is rotated in a predetermined direction, a pulse of a direction opposite to the predetermined direction is generated inadvertently.

In order to eliminate the disadvantage, it is necessary to provide a click mechanism for establishing a predetermined positional relationship between the movable contact plate 103 and the ball 104 to stop the shaft 107 at a predetermined position. However, even if a click mechanism is provided, it sometimes occurs that the shaft 107 is not stopped at any of the predetermined positions. Consequently, the disadvantage described above still remains not solved.

Further, when such a rotary pulse generator is employed as an operating section for such an electronic volume varying apparatus as described above, an input pulse from the rotary pulse generator to the electronic volume varying apparatus often has a chattering portion at a rear or trailing end thereof. Such chattering portion will obstruct accurate detection of the input pulse. Conventionally, an input pulse is detected in accordance with such an input pulse detecting method as described below.

In particular, referring to FIG. 14, there is shown an input pulse P having a chattering portion $P_T$ which appears at a trailing end thereof. An input signal including such input pulse P is sampled in a sampling period $S_1$, which is used to detect presence or absence of an input pulse P and, when an input pulse P is present, process or ignore a chattering portion $P_T$ of the input pulse P.

Thus, the input signal is successively sampled for each sampling period $S_1$, and when the sampled value first presents a predetermined input pulse value continuously for a plurality of periods such as at points of time $t_3$ to $t_5$ and then presents the value 0, it is detected as one input pulse P.

With the conventional input pulse detecting method, if the sampling period $S_1$ is made so long that the chattering portion $P_T$ shown in FIG. 14 may not be identified as a portion of an input pulse P, then in case the width of the input pulse P is shorter than the sampling period $S_1$, the input pulse P cannot be detected accurately.

On the contrary, if the sampling period $S_1$ is made so short that an input pulse P of a minimum width may be detected, then the chattering portion $P_T$ is sometimes detected as an input pulse P. Accordingly, it is not possible to process the chattering portion $P_T$ to detect an input pulse accurately with the single sampling period $S_1$.

SUMMARY OF THE INVENTION

It is an object of the present invention to provide an electronic volume varying apparatus which prevents a listener of an audio apparatus, in which the electronic volume varying apparatus is incorporated, from being surprised by a great sound volume after cancellation of a muting mode of the audio apparatus.

It is another object of the present invention to an input pulse detecting method by which an input pulse can be detected accurately.

It is a further object of the present invention to provide a pulse switch apparatus which prevents inadvertent outputting of a pulse.

In order to attain the objects, according to a first aspect of the present invention, there is provided an electronic volume varying apparatus for producing a controlling signal to control an electronic volume, which comprises pulse inputting means for receiving an input pulse signal from a manually operable signal generating member, pulse counting means for counting pulses of the input pulse signal, memory means for storing therein an output of the pulse counting means, muting judging means for outputting a memory disabling signal in response to a muting-on signal, memory enabling/disabling means interposed between the pulse counting means and the memory means for normally permitting the output of the pulse counting means to be stored into the memory means but inhibiting, when the memory disabling signal is received from the muting judging means, the output of the pulse counting means from being stored into the memory means, and means for generating a controlling signal in response to data stored in the memory means.

With the electronic volume varying apparatus, the muting judging means outputs, when a muting-on signal is supplied thereto, a memory disabling signal for inhibiting the memory enabling/disabling means from outputting pulse count data to the memory device. Consequently, even if the manually operable signal generating member is operated in a muting mode of an audio apparatus in which the electronic volume varying apparatus, at least the controlling signal to increase the sound volume is not outputted to the electronic volume. Accordingly, there is an advantage that it can prevent a listener to the audio apparatus from being surprised with a great sound volume after cancellation of the muting mode.

According to another aspect of the present invention, there is provided an input pulse detecting method, which comprises the steps of sampling an input signal in a first sampling period, determining an input pulse when a plurality of successive sampled values of the input signal present a predetermined value, sampling the input signal once in a second sampling period longer than the first sampling period, and sampling the input signal in the first sampling period again.

With the input pulse detecting method, when an input pulse is determined in accordance with sampled values obtained by sampling an input signal in the first sampling period, the input signal is sampled once in the second sampling period longer than the first sampling period and then sampled in the first sampling period again. Consequently, a chattering portion which appears at a trailing end of the input pulse and accordingly is included in the second sampling period is ignored. Consequently, an input pulse, which may be received from a manually operable pulse generating member such as a rotary pulse generator and likely has a chattering portion at a training end thereof, can be detected accurately.

The input pulse detecting method is suitably performed by an input pulse detecting apparatus, which comprises pulse inputting means for receiving an input pulse signal from a manually operable signal generating member, sampling period setting means for alternatively setting a first sampling period or a second sampling period longer than the first sampling period, sampling means for sampling the input pulse signal in a sampling period set by the sampling period setting means, and determining means for successively comparing a sampled value from the sampling means with a predetermined value and determining an input pulse when a plurality of successive sampled values of the input signal from the sampling means present the predetermined value to output the input pulse and an input pulse detection signal therefrom, wherein the sampling period setting means normally sets the first sampling period, but when the input pulse detection signal is received from the determining means, the sampling period setting means sets the second sampling period once and then sets, when the second sampling period elapses, the first sampling period again.

According to a further aspect of the present invention, there is provided a pulse switch apparatus, which comprises a manually operable pulse generator for alternatively generating pulses for one or the other direction in accordance with a direction of operation thereof, a pulse presence/absence detector for outputting a pulse non-detection signal when no pulse is received from the pulse generator, a timer for outputting a time lapse signal when the pulse non-detection signal from the pulse presence/absence detector has continued for a preset time, and pulse passage controlling means for ignoring a first pulse from the rotary generator after the time lapse signal is received from the timer but passing therethrough a pulse or pulses following the first pulse.

With the pulse switch apparatus, the pulse passage controlling means ignores, after a time lapse signal is received from the timer, a first pulse from the rotary generator and then allows a pulse or pulses following the first pulse to pass therethrough. Accordingly, there is an advantage that inadvertent outputting of a pulse can be prevented.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

Figure 1:
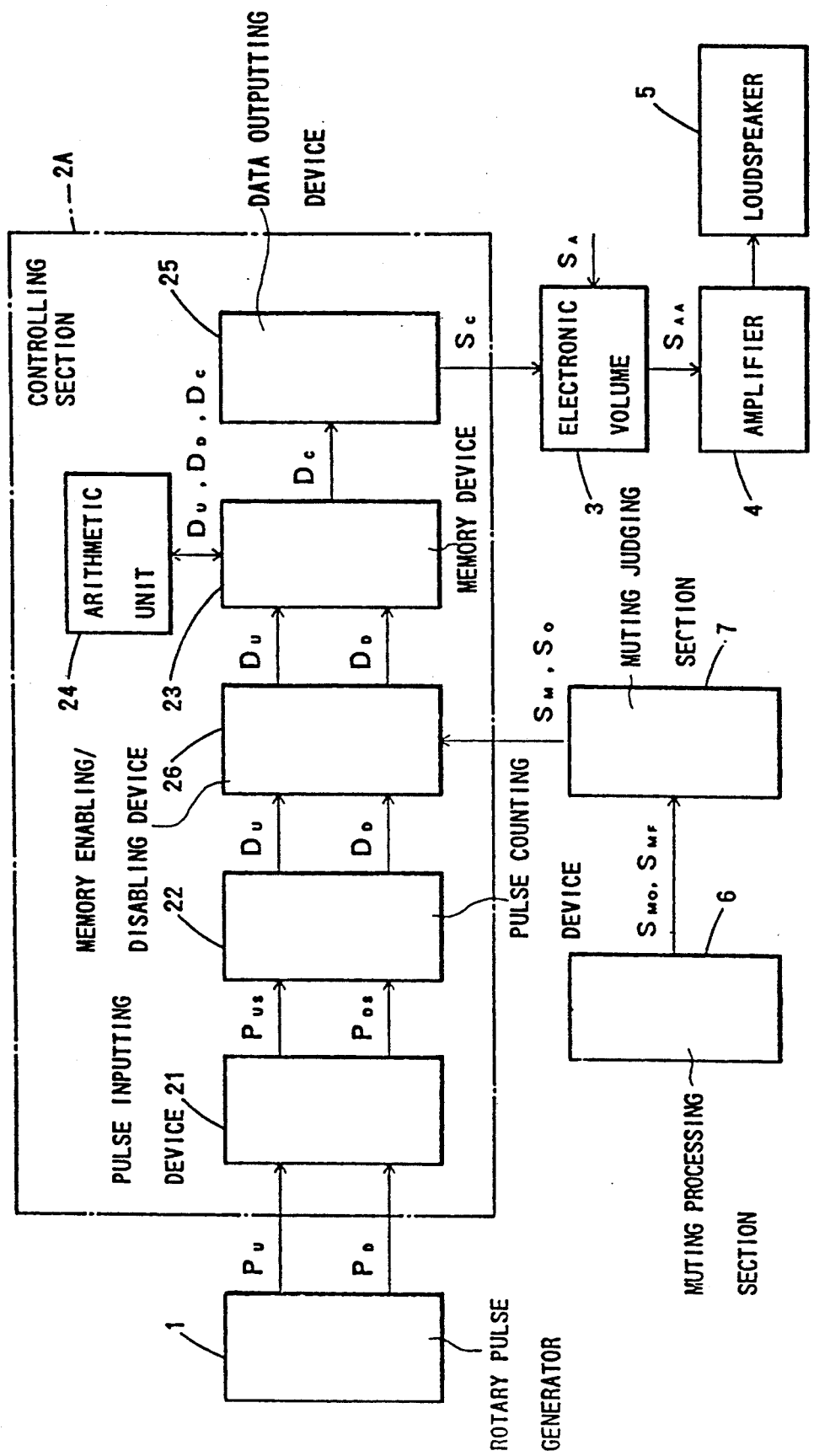
FIG. 1 is a block diagram showing an electronic volume varying apparatus to which the present invention is applied.
Figure 8:
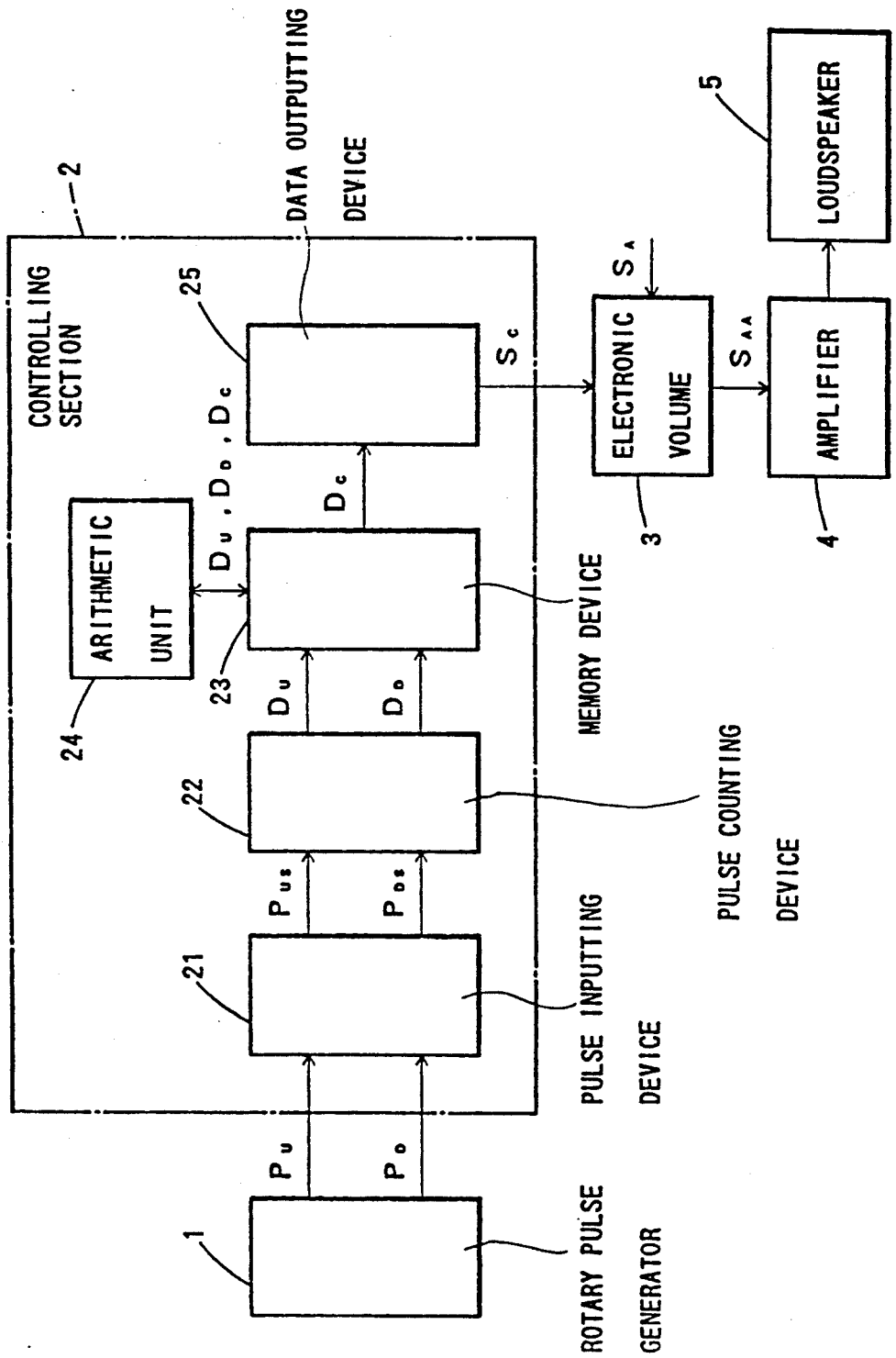
FIG. 8 is a block diagram showing a conventional electronic volume varying apparatus.

Referring first to FIG. 1, there is shown an electronic volume varying apparatus to which the present invention is applied. The electronic volume varying apparatus shown includes a controlling section 2A connected to receive up pulses PU or down pulses PD from a rotary pulse generator 1 which may be such a rotary pulse generator as shown shown in FIG. 9. The controlling section 2A includes a pulse inputting device 21, a pulse counting device 22, a memory device 23, an arithmetic unit 24 and a data outputting device 25 similar to those of the controlling section 2 of the conventional electronic volume varying apparatus described hereinabove with reference to FIG. 8. Further, an electronic volume 3 is connected to the data outputting device 25 of the controlling section 2A, and a loudspeaker 5 is connected to the electronic volume 3 by way of an amplifier 4, in a similar manner as described hereinabove.

The controlling section 2A of the electronic volume varying apparatus further includes a memory enabling-/disabling device 26 interposed between the pulse counting device 22 and the memory device 23. The memory enabling/disabling apparatus 26 is further connected to a muting judging section 7 which is in turn connected to a muting processing section 6. The muting processing section 6 outputs a muting-on signal $S_{MO}$ when, for example, a cassette deck in which the electronic volume varying apparatus is incorporated is in a fast feeding mode or a rewinding mode, but outputs a muting-off signal $S_{MF}$ when the cassette deck is in any other mode. The muting judging section 7 outputs a memory enabling signal $S_M$ to the memory enabling-/disabling device 26 when a muting-off signal $S_{MF}$ is received from the muting processing section 6, but outputs a memory disabling signal $S_O$ to the memory enabling/disabling device 26 when a muting-on signal $S_{MO}$ is received.

When a memory enabling signal SM is received from the muting judging section 7, the memory enabling-/disabling device 26 output up pulse count data $D_U$ or down pulse count data $D_D$ transmitted thereto from the pulse counting device 22 to the memory device 23. On the contrary, when a memory disabling signal $S_O$ is received from the muting judging section 7, the memory enabling/disabling device 26 stops outputting of up pulse count data $D_U$ or down pulse counter data $D_D$ from the pulse counting device 22 to the memory device 23.

In operation, first, when a muting-off signal $S_{MF}$ is outputted from the muting processing section 6, the muting judging section 7 outputs a memory enabling signal $S_M$ to the memory enabling/disabling device 26. Consequently, the memory enabling/disabling device 26 passes therethrough up pulse count data DU or down pulse count data DD supplied thereto from the pulse counting device 22. Accordingly, the memory device 23, arithmetic unit 24 and data outputting section 25 of the controlling section 2A, the electronic volume 3, the amplifier 4 and the loudspeaker 5 operate in a similar manner as those of the conventional electronic volume varying apparatus described hereinabove with reference to FIG. 8.

On the contrary, when a muting-on signal $S_{MO}$ is outputted from the muting processing section 6, the muting judging section 7 outputs a memory disabling signal $S_O$ to the memory enabling/disabling device 26. Consequently, the memory enabling/disabling device 26 stops outputting of up pulse count data $D_U$ or down pulse count data $D_D$ supplied thereto from the pulse counting device 22 to the memory device 23. As a result, even if the rotary pulse generator 1 is operated, in controlling signal $S_C$ outputted from the data outputting device 25 does not present any change.

As described above, with the present electronic volume varying apparatus, when a memory disabling signal $S_O$ is received, in a muting mode of the cassette deck, from the muting judging section 7, the memory enabling/disabling device 26 stops its outputting of up pulse count data $D_U$ or down pulse count data $D_D$ from the pulse counting device 22 to the memory device 23, and consequently, even if the rotary generator 1 is operated in a muting mode of the cassette deck, the controlling signal $S_C$ for controlling the electronic volume 3 is not changed at all.

Accordingly, even if the rotary pulse generator 1 is operated in a muting mode, a listener will not be surprised by the great sound volume after cancellation of the muting mode.

It is to be noted that, while the rotary pulse generator 1 is employed as an operating section, the operating section may otherwise be constructed such that, for example, it includes an up key and a down key and outputs, when the up key or the down key is operated, an up pulse $P_U$ or a down pulse $P_D$.

Further, while the memory enabling/disabling device 26 is described to stop, when a memory disabling signal $S_O$ is received, its outputting of up pulse count data $D_U$ or down pulse count data $D_D$ to the memory device 23, a similar effect can be obtained by an alternative construction that, when a memory disabling signal $S_O$ is received, it stops its outputting only of up pulse count data $D_U$ to the memory device 23.

Figure 2:
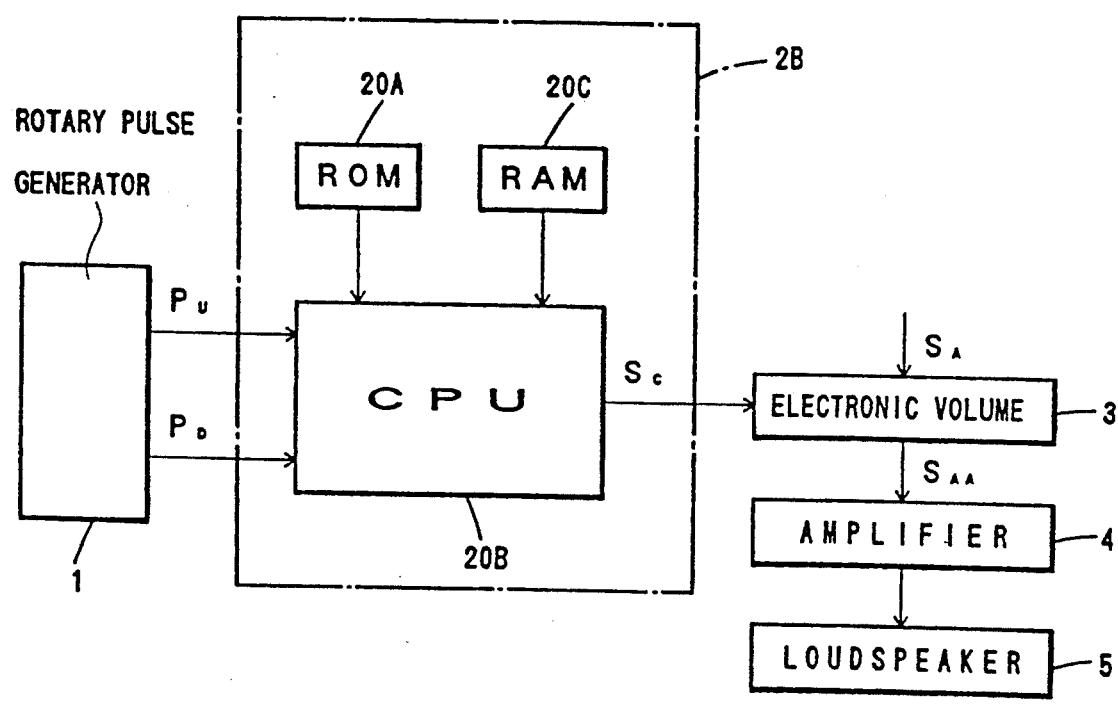
FIG. 2 is a block diagram showing another electronic volume varying apparatus to which the present invention is applied.

Referring now to FIG. 2, there is shown another electronic volume varying apparatus to which the present invention is applied. The electronic volume varying apparatus shown includes a microcomputer 2B connected to receive up pulses $P_U$ or down pulses $P_D$ from a rotary pulse generator 1 which serves as an operating section and may be such a rotary pulse generator as described hereinabove with reference to FIG. 9. The microcomputer 2B includes a ROM 20A, a central processing unit (CPU) 20B and a RAM 20C, and outputs a controlling signal $S_C$ in accordance with up pulses $P_U$ or down pulses $P_D$ received from the rotary generator 1. Further, an electronic volume 3 is connected to the CPU 20B of the microcomputer 2B, and a loudspeaker 5 is connected to the electronic volume 3 by way of an amplifier 4, in a similar manner as described hereinabove.

Figure 4:
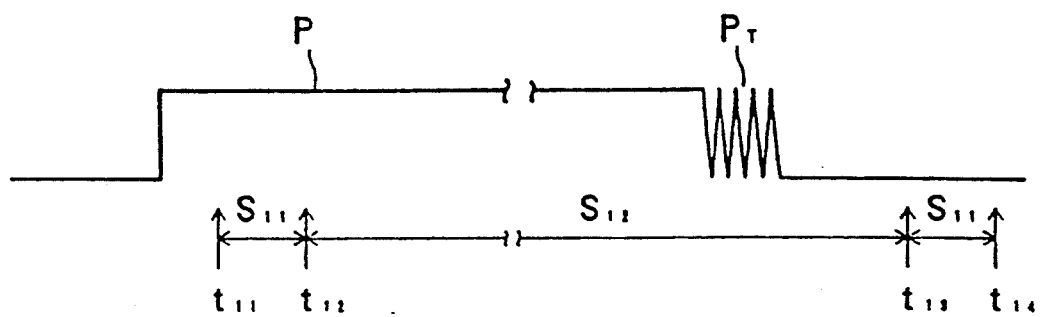
FIG. 4 is a waveform diagram illustrating detection of an input pulse by the electronic volume varying apparatus of FIG. 2.

Since the rotary pulse generator 1 is employed as an operating section, an input pulse to the CPU 20B of the microcomputer 2B often has a chattering portion at a rear or trailing end thereof as described hereinabove. Referring to FIG. 4, there is illustrated an input pulse detecting method according to the present invention. An input signal shown to the CPU 20B includes an input pulse P having a chattering portion $P_T$ and is first sampled in a first sampling period $S_{11}$ which is, for example, 400 μs and then sampled in a second sampling period $S_{12}$ which is, for example, 2 ms.

Figure 3:
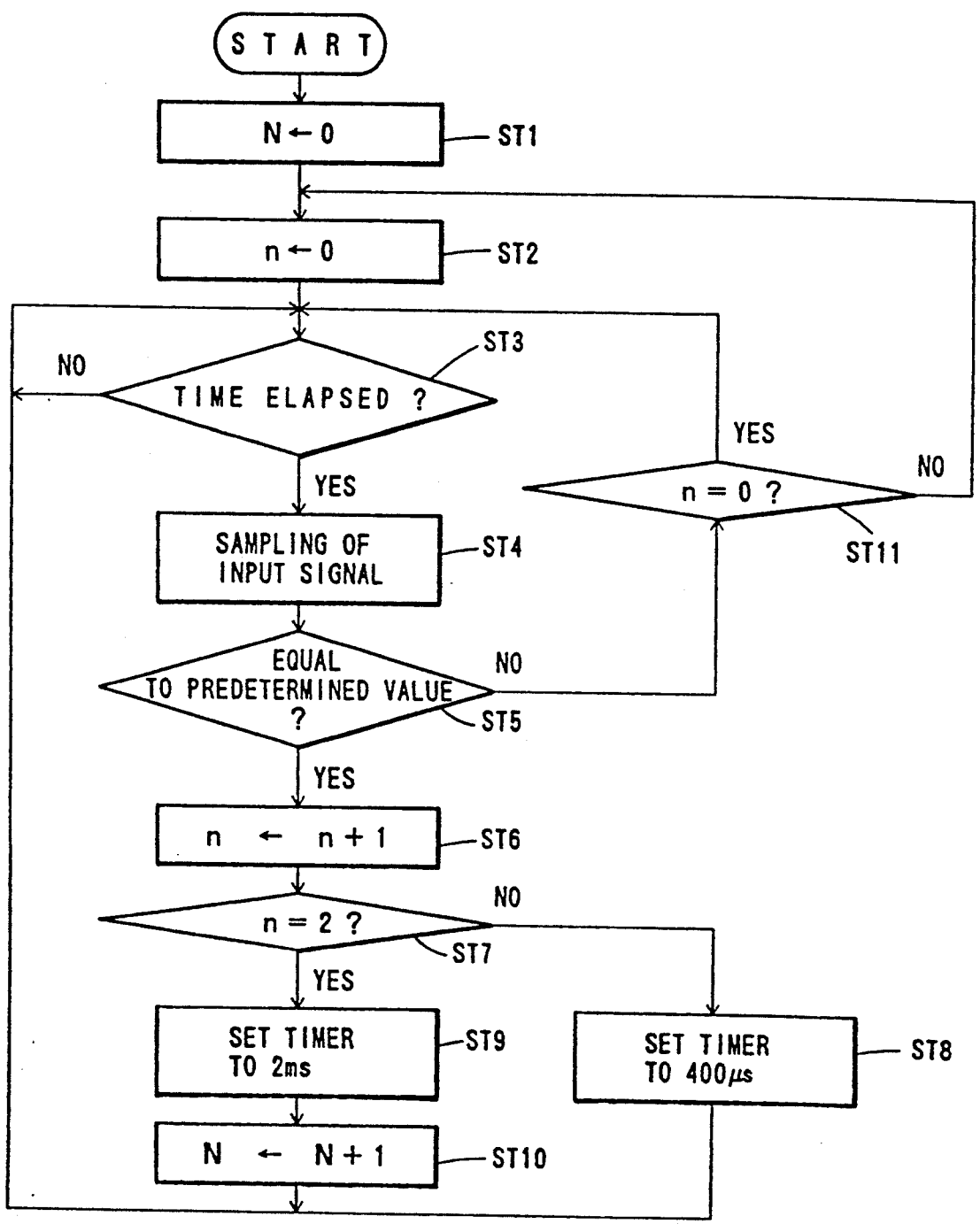
FIG. 3 is a flow chart of input pulse detecting processing of the electronic volume varying apparatus of FIG. 2.

The input pulse detecting method will be described more in detail below with reference to FIG. 3. It is assumed here that the width of an input pulse P is 1 ms and the period of the input pulse P is 2 ms.

First, the CPU 20B resets the input pulse count number N to 0 and stores it into the RAM 20C at step ST1, and then it sets the number n of occurrences, by which a sampled value presents a predetermined value, to 0 and stores it into the RAM 20C step ST2. Then, it judges, at step ST3, whether or not a timer constructed in software therein counts to a predetermined timer value, that is, whether or not a predetermined interval of time which is equal to a sampling period has elapsed. If the predetermined interval of time has not elapsed, then the CPU 20B waits until the predetermined interval of time elapses.

Since a sampling period has not been set as yet and is equal to 0 at an initial stage, the predetermined interval of time elapses immediately, and accordingly, the CPU 20B samples an input signal at step ST4 and then judges, at step ST5, whether or not the thus sampled value is equal to or higher than a predetermined level for the determination of an input pulse P. Then, if the sampled value is equal to the predetermined value, then the occurrence number n is incremented by 1 and the new occurrence number n is stored into the RAM 20C at step ST6, and then the CPU 20B judges, at step ST7, whether or not the occurrence number n is equal to 2.

If it is judged at step ST7 that the occurrence number n is not equal to 2, that is, if the time number n is equal to 1, then the software timer is set to the first sampling period $S_{11}$ (400 μs) at step ST8, and after then, the control sequence returns to step ST3.

On the contrary, if it is judged at step ST7 that the occurrence number n is equal to 2, then since this means that the two successive sampled values belong to an input pulse P, the software timer is re-set to the second period $S_{12}$ (2 ms) at step ST9, and then the input pulse count number N is incremented by one and the new input pulse count number N is stored into the RAM 20C at step ST10, whereafter the control sequence returns to step ST3.

In the meantime, if it is judged at step ST5 that the sampled value is not equal to the predetermined value, then the CPU 20B judges at step ST11 whether or not the occurrence number n is equal to 0, and then if the occurrence number n is equal to 0, the control sequence returns to step ST3, but if the occurrence number n is not equal to 0, that is, if the occurrence number n is equal to 1, then the control sequence returns to step ST2.

Accordingly, an input pulse P is determined only when a sampled value is equal to the predetermined value successively twice as at a point of time $t_{11}$ and another point of time $t_{12}$ as seen in FIG. 4. When this is determined at step ST7, the control sequence advances to step ST9. Consequently, sampling in the first sampling period $S_{11}$ is re-started after sampling once in the second sampling period $S_{12}$ longer than the first sampling period $S_{11}$ for detection of an input pulse P. Accordingly, if the first sampling period $S_{11}$ is set to 400 μs and the second sampling period $S_{12}$ is set to 2 ms, even if an input pulse P is supplied for the period of 2 ms, the chattering portion PT which appears at a trailing end of the input pulse P can be processed, i.e., ignored, to detect the input pulse P accurately.

It is to be noted that the description above applies whether the input pulse P is an up pulse $P_U$ or a down pulse $P_D$.

Referring back to FIG. 2, a controlling signal $S_C$ is calculated, for example, for each 16 ms in accordance with an input pulse count number N of up pulses $P_U$ or down pulses $P_D$ detected in this manner. The controlling signal $S_C$ thus calculated is outputted to the electronic volume 3 while the data of the RAM 2C are cleared for each 16 ms.

Consequently, the electronic volume 3 attenuates a sound volume signal $S_A$ supplied thereto from an external circuit not shown in accordance with the controlling signal $S_C$ received from the CPU 20B of the microcomputer 20B and outputs an attenuation signal $S_{AA}$ obtained by the attenuation to the amplifier 4. The attenuation signal $S_{AA}$ is amplified by the amplifier 4 and sent to the loudspeaker 5, and consequently, sound the volume of which is adjusted in accordance with the attenuation signal $S_{AA}$ is generated from the loudspeaker 5.

Figure 5:
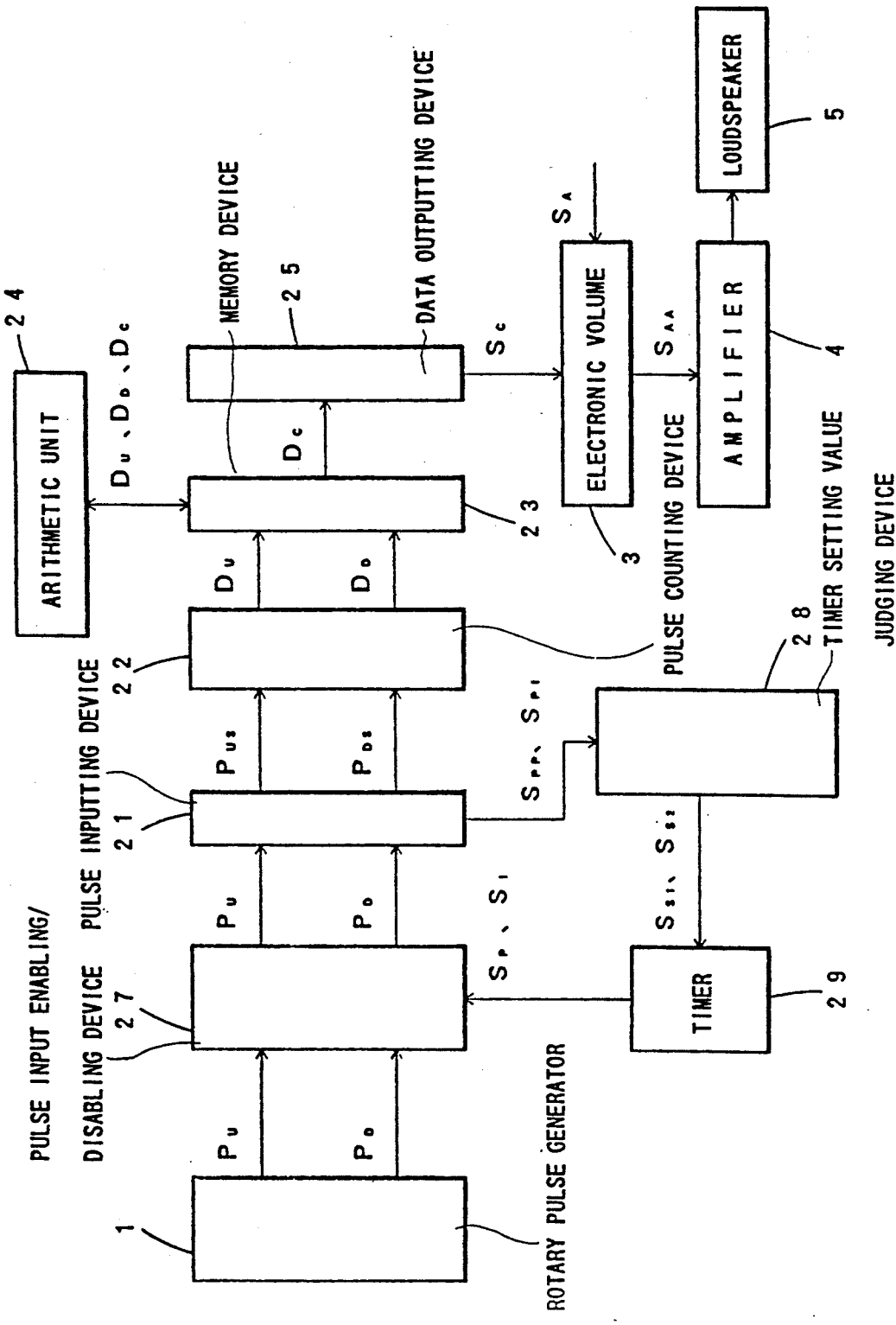
FIG. 5 is a block diagram showing a further electronic volume varying apparatus to which the present invention is applied.

Referring now to FIG. 5, there is shown a further electronic volume varying apparatus to which the present invention is applied. The electronic volume varying apparatus shown includes a pulse input enabling/disabling device 27, which passes, when a pulse input enabling signal $S_P$ is supplied thereto from a timer 29 which will be hereinafter described, up pulses $P_U$ or down pulses $P_D$ from a rotary pulse generator 1 therethrough, but it does not pass, when a pulse input disabling signal $S_1$ is supplied thereto from the timer 29, up pulses $P_U$ or down pulses $P_D$ from the rotary pulse generator 1 therethrough.

The electronic volume varying apparatus further includes a pulse inputting device 21, which outputs, when an up pulse $P_U$ or a down pulse $P_D$ is supplied successively twice thereto from the pulse input enabling/disabling device 27, an up pulse confirmation signal $P_{US}$ or a down pulse confirmation signal $P_{DS}$ and outputs a pulse confirmation signal $S_{PP}$, but it does not output, when an up pulse $P_U$ or a down pulse $P_D$ is not supplied successively, an up pulse confirmation signal $P_{US}$ or a down pulse confirmation signal $P_{DS}$ but outputs a pulse non-confirmation signal $S_{PI}$.

The electronic volume varying apparatus further includes a timer setting value judging device 28, which outputs, when a pulse non-confirmation signal $S_{PI}$ is supplied thereto from the pulse inputting device 21, a first setting signal $S_{S1}$ for setting a first sampling period ($S_{11}$) to 400 μs, but outputs, when a pulse confirmation signal $S_{PP}$ is supplied thereto from the pulse inputting device 21, a second setting signal $S_{S2}$ for setting a second sampling period ($S_{12}$), which is longer than the first sampling period ($S_{11}$), to 2 ms.

The timer 29 mentioned above is constructed such that the timer value which defines a sampling period is set to 400 μs or 2 ms in accordance with the first or second setting signal $S_{S1}$ or $S_{S2}$ supplied thereto from the timer setting value judging device 28. The timer 29 outputs a pulse input enabling signal $S_P$ each time the preset sampling period elapses, but outputs a pulse input disabling signal $S_I$ in any other case.

The electronic volume varying apparatus further includes a memory device 23, which stores therein up pulse count data $D_U$ or down pulse count data $D_D$ from the pulse count device 22 and control data $D_C$ from an arithmetic unit 24. The arithmetic unit 24 calculates, in accordance with count data $D_U$ or $D_D$ of the memory device 23, control data $D_C$ for controlling an electronic volume 3 and outputs the control data $D_C$ to the memory device 26.

The electronic volume varying apparatus further includes a data outputting device 25, which outputs a controlling signal $S_C$ in accordance with control data $D_C$ of the memory device 23.

It is to be noted that the pulse input enabling/disabling device 27, pulse inputting device 21, pulse counting device 22, memory device 23, arithmetic unit 24 and data outputting device 25 may be constituted from a microcomputer.

In operation, first, when operation is started in a condition wherein no sampling period is set in the timer 29, since the timer value elapses immediately and the timer 29 outputs a pulse input enabling signal $S_P$, the pulse input enabling/disabling device 27 passes an output of the rotary pulse generator 1 therethrough so that it is supplied to the pulse inputting device 21 only while the pulse input enabling signal $S_P$ remains supplied thereto.

In this condition, if an up pulse $P_U$ is not outputted from the rotary pulse generator 1, the pulse inputting device 21 outputs a pulse non-confirmation signal $S_{PI}$, and consequently, the timer setting value judging device 28 outputs a first setting signal $S_{S1}$ to set the period of the timer 29 to the first sampling period ($S_{11}$: 400 μs). Consequently, the period of the timer 29 is set to the first sampling period ($S_{11}$).

Then, if such an up pulse $P_U$ as shown in FIG. 4 is outputted from the rotary pulse generator 1 in a condition wherein the period of the timer 29 is set to the first sampling period ($S_{11}$), then the timer 29 outputs a pulse input enabling signal $S_P$ for each 400 μs, and consequently, the pulse input enabling/disabling device 27 outputs an input signal from the rotary pulse generator 1 to the pulse inputting device 21.

Consequently, the pulse inputting device 21 outputs an up pulse confirmation signal $P_{US}$ and a pulse confirmation signal $S_{PP}$ when an up pulse $P_U$ is supplied successively twice thereto, the timer setting value judging device 23 outputs a second setting signal $S_{S2}$ to set the period of the timer 29 to the second sampling period ($S_{12}$: 2 ms), and consequently, the period of the timer 29 is set to the second sampling period ($S_{12}$).

Since the operation described above is repeated after the period of the timer 29 has been set to the second sampling period $S_{12}$ in this manner, even if a chattering portion $P_T$ is present at a trailing end of an up pulse $P_U$, the up pulse $P_U$ can be detected accurately as described above.

It is to be noted that, also in case a down pulse $P_D$ is outputted from the rotary pulse generator 1, it can be detected accurately by similar operation to that described above.

When an up pulse confirmation signal $P_{US}$ or a down pulse confirmation signal $P_{DS}$ is received from the pulse inputting device 21 as described above, the pulse counting device 22 outputs, after each predetermined interval of time, up pulse count data $D_u$ or down pulse count data $D_D$ obtained by counting up pulse confirmation signals $P_{US}$ or down pulse confirmation signals $P_{DS}$, and consequently, the memory device 23 stores therein the pulse count data $D_U$ or $D_D$.

Then, since the arithmetic unit 24 calculates control data $D_C$ in accordance with the pulse count data $D_U$ or $D_D$ of the memory device 23 and stores them back into the memory device 23, a control signal $S_C$ based on the control data $D_C$ is outputted from the data outputting device 25, and then the data in the memory device 23 are cleared.

Consequently, the electronic volume 3 attenuates a sound volume signal $S_A$ supplied thereto from an external circuit not shown in accordance with the controlling signal $S_C$ received from the data outputting device 25 and outputs an attenuation signal $S_{AA}$ obtained by the attenuation to the amplifier 4. The attenuation signal $S_{AA}$ is amplified by the amplifier 4 and sent to the loudspeaker 5, and consequently, sound the volume of which is adjusted in accordance with the attenuation signal $S_{AA}$ is generated from the loudspeaker 5.

It is to be noted that, while the first sampling period $S_{11}$ is set to 400 μs and the second sampling period $S_{12}$ is set to 2 ms in the description above, the sampling periods not be limited to those specific values and may be determined taking a minimum width (time) of an input pulse P and a time of a chattering portion $P_T$ of the input pulse P into consideration.

It is to be noted that, while the rotary pulse generator 1 is employed as an operating section, the operating section may otherwise be constructed such that, for example, it includes an up key and a down key and outputs, when the up key or the down key is operated, an up pulse $P_U$ or a down pulse $P_D$.

Further, while the number of occurrences of a condition wherein an input signal is equal to or higher than the predetermined value is described to be twice, it may otherwise be three or more times.

Figure 6:
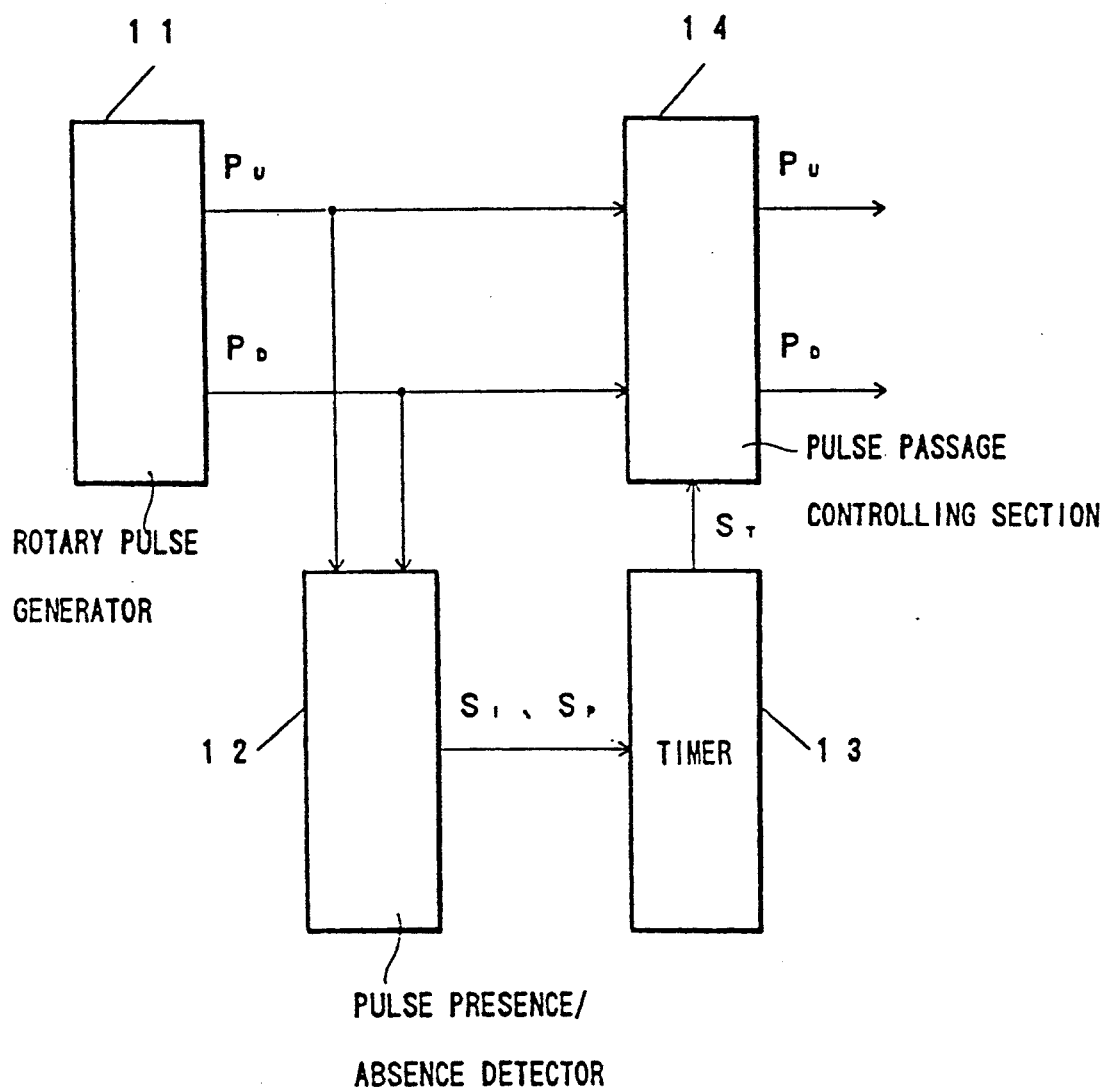
FIG. 6 is a block diagram showing a pulse switch apparatus to which the present invention is applied.

Referring now to FIG. 6, there is shown a pulse switch apparatus to which the present invention is applied. The pulse switch apparatus shown includes a rotary pulse generator 11 serving as a pulse generator. The rotary generator 11 may be such a rotary pulse generator as described hereinabove with reference to FIG. 9.

The pulse switch apparatus further includes a pulse presence/absence detector 12, which outputs a pulse non-detection signal $S_1$ when an up pulse $P_U$ or a down pulse $P_D$ is not supplied thereto from the rotary pulse generator 11, but outputs a pulse detection signal $S_P$ when an up pulse $P_U$ or a down pulse $P_D$ is supplied thereto from the rotary pulse generator 11.

The pulse switch apparatus further includes a timer 13, which is set in response to a pulse non-detection signal $S_1$ from the pulse presence/absence detector 12 but is reset in response to a pulse detection signal $S_P$ from the pulse presence/absence detector 12, and outputs a time lapse signal $S_T$ when a preset time, for example, 0.5 seconds, elapses after it has been set.

The pulse switch apparatus further includes a pulse passage controlling section 14, which ignores or does not pass therethrough a first one of up pulses $P_U$ or down pulses $P_D$ supplied thereto from the rotary pulse generator 11 after a time lapse signal $S_T$ has been supplied from the timer 13, but passes the second up pulse $P_U$ or down pulse $P_D$ therethrough.

Figure 9:
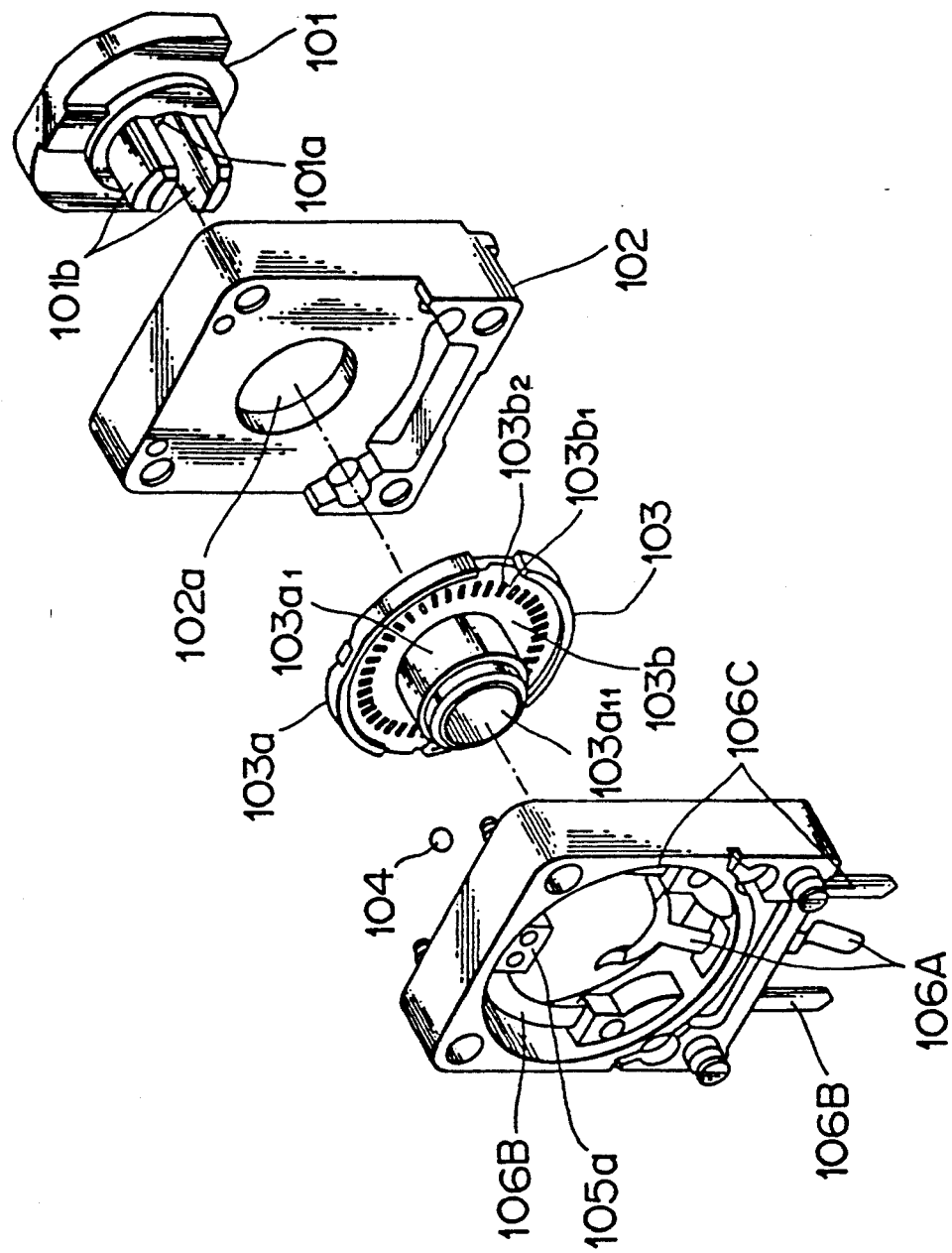
FIG. 9 is a fragmentary perspective view showing a rotary pulse generator which is used with an electronic volume varying apparatus.
Figure 10:
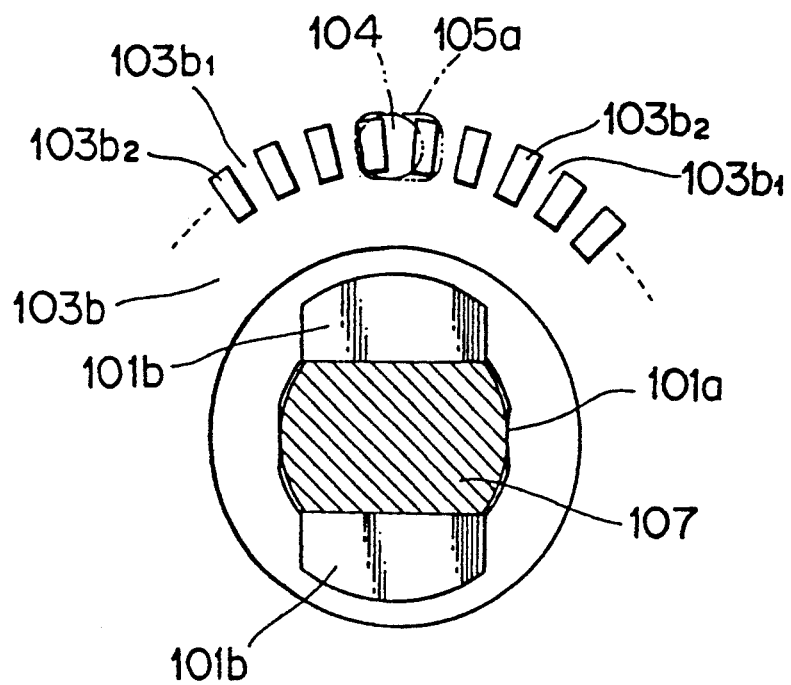
FIG. 10 is a schematic partial sectional view showing the rotary pulse generator of FIG. 9.
Figure 11A:
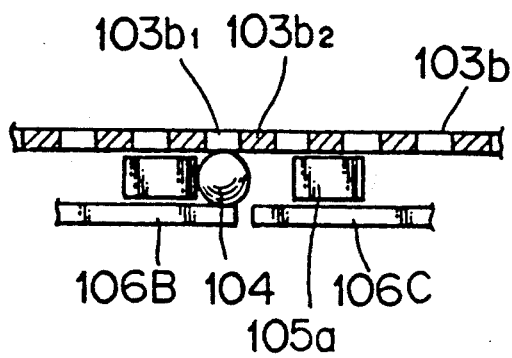
FIGS. 11a to 11c are schematic sectional views showing different stages of operation of the rotary pulse generator of FIG. 9.
Figure 11B:
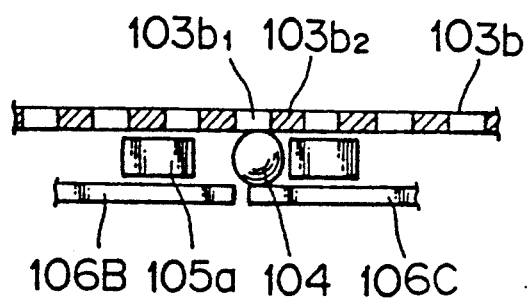
Figure 11C:
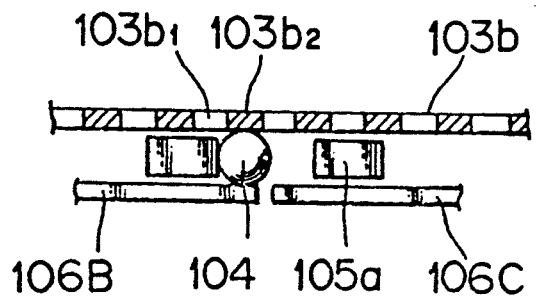
Figure 12A:
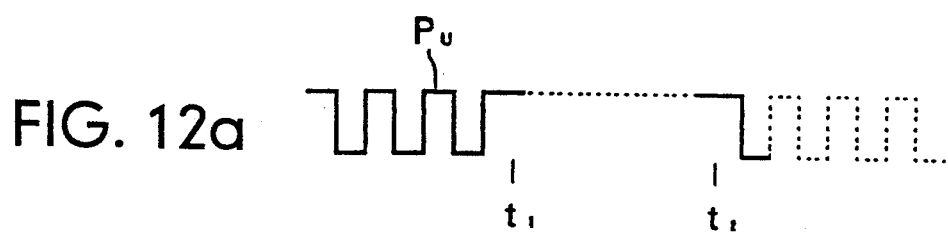
FIG. 12 is a waveform diagram showing outputs of the rotary pulse generator of FIG. 9.
Figure 12:
Figure 13A:
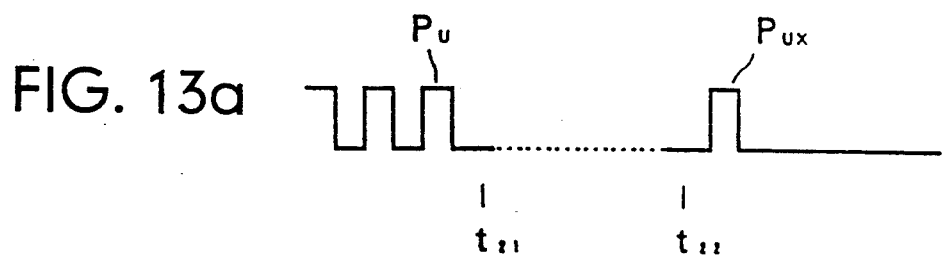
FIG. 13 is a waveform diagram showing outputs of the rotary pulse generator of FIG. 9 but in a different condition.
Figure 13B:
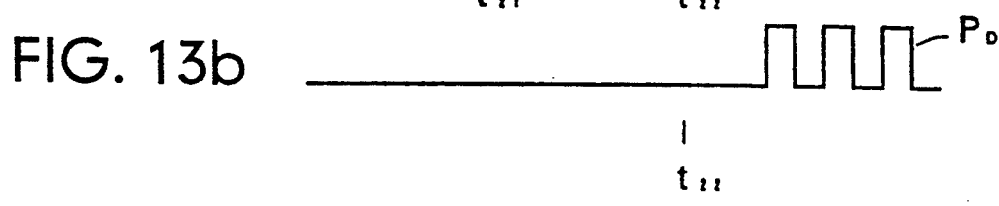
Figure 14:
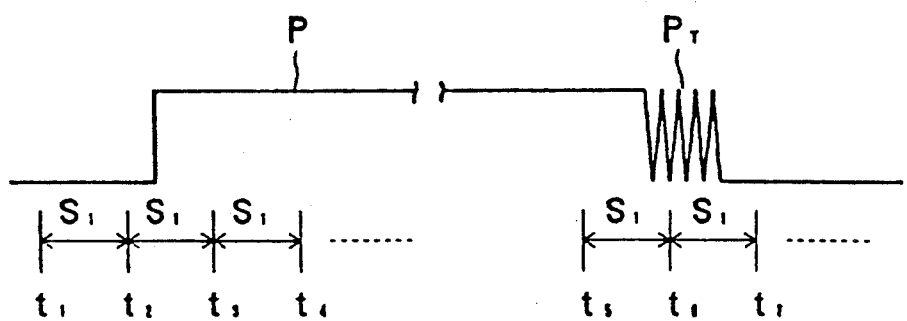
FIG. 14 is a waveform diagram illustrating a conventional input pulse detecting method.

In operation, first, in case the shaft 107 of the rotary pulse generator 11 shown in FIG. 9 is rotated in the up direction or counterclockwise direction in FIG. 10 so that an up pulse $P_U$ is outputted from the rotary pulse generator 11 as seen from the curve (a) of FIG. 13 and then the shaft 107 is stopped at a point of time $t_{21}$ in a condition wherein an up pulse $P_U$ is at a low level, that is, the ball 104 contacts with a non-conducting portion $103b_2$ of the movable contact 103 and the first terminal 106B, whereafter the shaft 107 is rotated in the down or clockwise direction at another point of time $t_{22}$ after lapse of a predetermined interval of time, then an up pulse $P_{UX}$ is first generated and then down pulses $P_D$ are outputted as seen from the curve (b) of FIG. 13 as described hereinabove.

Meanwhile, the pulse presence/absence detector 12 outputs a pulse non-detection signal $S_1$, for example, at a falling or trailing edge of the up pulse $P_U$ prior to the point of time $t_{21}$ to set the timer 13, and then outputs a pulse detection signal $S_P$ at a rising edge of the up pulse $P_{UX}$ after the point of time $t_{22}$ to reset the timer 13.

In this instance, if the time until the timer 13 is reset after it has been reset is longer than the preset time, then the timer 13 outputs a time lapse signal $S_T$ to the pulse passage controlling section 14, and consequently, the pulse passage controlling section 14 ignores (does not pass therethrough) the first pulse after the time lapse signal $S_T$ has been supplied thereto whether or not the first pulse is an up pulse $P_U$ ($P_{UX}$) or a down pulse $P_D$, but passes the second up pulse $P_U$ or down pulse $P_D$ therethrough.

Accordingly, if the preset time of the timer 13 is equal, for example, to 0.5 seconds, then in case the interval of time after the shaft 107 of the rotary pulse generator 11 is rotated in a predetermined direction until the shaft 107 is rotated in the reverse direction is longer than 0.5 seconds, since this is a condition wherein the shaft 107 is rotated but not continuously, an up pulse $P_{UX}$ or a down pulse $P_D$ which is generated first at an initial stage when the shaft 107 is rotated in the down direction or the up direction is ignored and is not outputted as described above. Consequently, inadvertent outputting of a pulse can be prevented.

However, in case the shaft 107 is rotated in the reverse direction within the preset time of the timer 13, since this is another condition wherein the shaft 107 is rotated continuously, this is not inadvertent outputting of a pulse.

Figure 7:
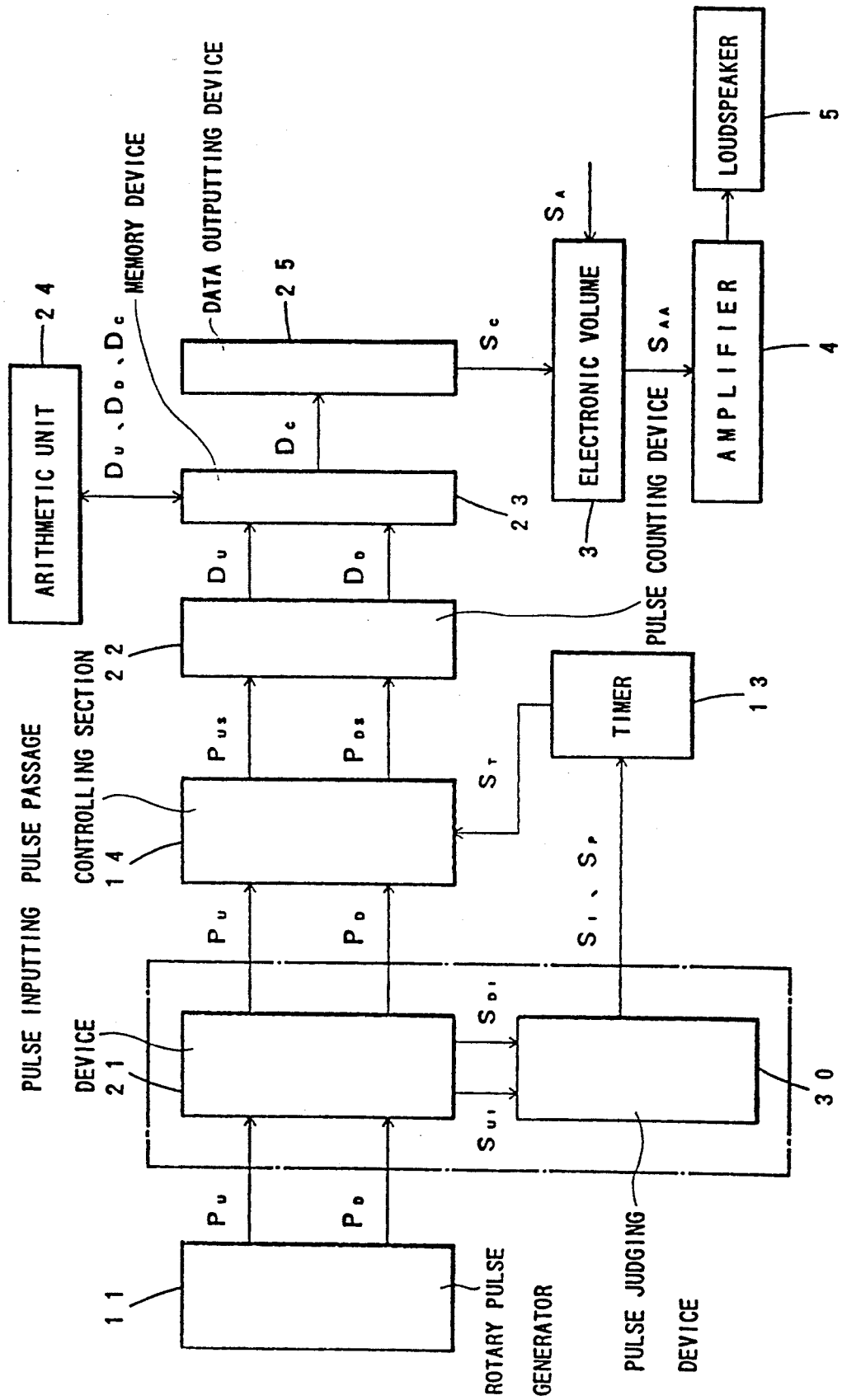
FIG. 7 is a block diagram showing a still further electronic volume varying apparatus to which the present invention is applied.

Referring now to FIG. 7, there is shown a still further electronic volume varying apparatus to which the present invention is applied. The electronic volume varying apparatus is a modification to the electronic volume varying apparatus of FIG. 5 and incorporates therein a modification to the pulse switch apparatus of FIG. 6.

In particular, the modified pulse switch apparatus incorporated in the electronic volume varying apparatus includes a rotary pulse generator 11, a timer 13 and a pulse passage controlling section 14 similarly to the pulse switch apparatus of FIG. 6. The modified pulse switch apparatus includes, in place of the pulse presence/absence detector 12 of the pulse switch apparatus of FIG. 6, a pulse inputting apparatus 21 and a pulse judging device 30. The pulse inputting apparatus outputs an up pulse confirmation signal $P_{US}$ or a down pulse confirmation signal $P_{DS}$ when an up pulse $P_U$ or a down pulse $P_D$ is supplied thereto from the rotary generator 11, and outputs an up pulse non-confirmation signal $S_{U1}$ when an up pulse $P_U$ is not supplied thereto, but outputs a down pulse non-confirmation signal $S_{D1}$ when a down pulse $P_D$ is not supplied thereto. The pulse judging device 30 outputs a pulse non-detection signal $S_1$ for setting a timer 13 when neither of an up pulse non-confirmation signal $S_{U1}$ and a down pulse non-confirmation confirmation signal $S_{D1}$ is supplied thereto from the pulse inputting device 21, but outputs a pulse detection signal $S_P$ for resetting the timer 13 when an up pulse non-confirmation signal $S_{U1}$ or a down pulse non-confirmation signal $S_{D1}$ is supplied thereto from the pulse inputting device 21.

The electronic volume varying apparatus further includes a pulse counting device 22, a memory device 23, an arithmetic unit 24 and a data outputting device 25 similar to the electronic volume varying apparatus of FIG. 5 described hereinabove. An electronic volume 3 is connected to the data outputting device 25, and a loudspeaker 5 is connected to the electronic volume 3 by way of an amplifier 4 similarly as in the arrangement shown in FIG. 5.

Thus, when an up pulse confirmation signal $P_{US}$ or a down pulse confirmation signal $P_{DS}$ is supplied from the pulse passage controlling section 14 as described hereinabove, the pulse counting device 22 outputs, after each predetermined interval of time, up pulse count data $D_U$ or down pulse count data $D_D$ obtained by counting up pulse confirmation signals $P_{US}$ or down pulse confirmation signals $P_{DS}$. Consequently, the memory device 23, arithmetic unit 24, data outputting device 25, electronic volume 3, amplifier 4 and loudspeaker 5 operate in a similar manner as in the electronic volume varying apparatus of FIG. 5 described hereinabove. Accordingly, sound the volume of which is adjusted in accordance with an attenuation signal $S_{AA}$ is generated from the loudspeaker 5.

Thus, with the electronic volume varying apparatus, the electronic volume 3 is prevented from being varied in response to inadvertant outputting of a pulse, and consequently, the situation that the volume of sound becomes small after it has been increased once or the volume of sound becomes great after it has been decreased once contrary to an operation of the pulse generator 11 is eliminated.

It is to be noted that, while the preset time of the timer 13 is described to be equal to 0.5 seconds, this is a mere example, and inadvertent outputting of a pulse can be eliminated without an unfamiliar feeling by suitably changing the preset time.

Having now fully described the invention, it will be apparent to one of ordinary skill in the art that many changes and modifications can be made thereto without departing from the spirit and scope of the invention as set forth herein.

What is claimed is:

1. An electronic volume varying apparatus for producing a controlling signal to control an audio volume level comprising:
    pulse inputting means for receiving an input pulse signal from a manually operable audio level controlling means;
    pulse counting means for counting pulses of the input pulse signal;
    memory means for storing therein an input of said pulse counting means;
    muting judging means for outputting a memory disabling signal in response to a muting-on signal
    memory enabling/disabling means interposed between said pulse counting means and said memory means for normally permitting the output of said pulse counting means to be stored into said memory means but inhibiting, when the memory disabling signal is received from said muting judging means, the output of said pulse counting means from being stored into said memory means; and
    means for generating a controlling signal in response to data stored in said memory means.

2. An electronic volume varying apparatus as claimed in claim 1, wherein said memory enabling/disabling means inhibits, when the memory disabling signal is received, storage into said memory means of count data from said pulse counting means when the count data are obtained by counting up pulses from said pulse inputting means.

3. An input pulse detecting method, comprising the steps of:
    sampling an input signal in a first sampling period;
    determining when a plurality of successive sampled values of the input signal have a predetermined value;
    sampling the input signal once in a second sampling period longer than the first sampling period: and
    sampling the input signal in the first sampling period again.

4. An input pulse detecting method as claimed in claim 3, wherein an input pulse is determined, at the determining step, when two successively sampled values of the input signal have the predetermined value.

5. An input pulse detecting apparatus, comprising:
    pulse inputting means for receiving an input pulse signal from a manually operable audio level controlling means;
    sampling period setting means for alternatively setting a first sampling period or a second sampling period longer than the first sampling period;
    sampling means for sampling the input pulse signal in a sampling period set by said sampling period setting means; and
    determining means for successively comparing a sampled value from said sampling means with a predetermined value and, when a plurality of successive sampled values of the input signal from said sampling means have the predetermined value, outputting the input pulse and an input pulse detection signal therefrom;
    wherein said sampling period setting means normally sets the first sampling period, but when the input pulse detection signal is received from said determining means, said sampling period setting means sets the second sampling period once and then sets, when the second sampling period elapses, the first sampling period again.

6. An input pulse detecting apparatus as claimed in claim 5, wherein said sampling means includes gating means for inhibiting inputting of the input pulse signal from said manually operable signal generating member to said pulse inputting means in the second sampling period set by said sampling period setting means.

7. An electronic volume varying apparatus for producing a controlling signal to control an audio volume level:
    pulse inputting means for receiving an input pulse signal from a manually operable audio level controlling means:
    sampling period setting means for alternatively setting a first sampling period or a second sampling period longer than the first sampling period;
    sampling means for sampling the input pulse signal in a sampling period set by said sampling period setting means;
    determining means for successively comparing a sampled value from said sampling means with a predetermined value and determining an input pulse when a plurality of successive sampled values of the input signal from said sampling means present the predetermined value to output the input pulse and an input pulse detection signal;
    said sampling period setting means normally setting the first sampling period whereas, when the input pulse detection signal is received from said determining means, said sampling period setting means sets the second sampling period once and then sets, when the second sampling period elapses, the first sampling period again;
    pulse counting means for counting the input pulse from said determining means;
    memory means for storing therein an output of said pulse counting means; and
    means for generating a controlling signal in response to data stored in said memory means.

8. An electronic volume varying apparatus as claimed in claim 7, wherein said sampling means includes gating means for inhibiting inputting of the input pulse signal from said manually operable signal generating member to said pulse inputting means in the second sampling period set by said sampling period setting means.

9. A pulse switch apparatus, comprising:
    a manually operable pulse generator for generating pulses in accordance with a direction of operation thereof;
    a pulse presence/absence detector for outputting a pulse non-detection signal when no pulse is received from said pulse generator;
    a timer for outputting a time lapse signal when the pulse non-detection signal from said pulse presence/absence detector has continued for a preset time; and
    pulse passage controlling means for ignoring a first pulse from said rotary generator after the time lapse signal is received from said timer but passing therethrough a pulse or pulses following the first pulse.

10. An electronic volume varying apparatus for producing a controlling signal to control an audio volume level, comprising:

a manually operable pulse generator for generating pulses in accordance with a direction of operation thereof;

a pulse presence/absence detector for outputting a pulse non-detection signal when no pulse is received from said pulse generator;

a timer for outputting a time lapse signal when the pulse non-detection signal from said pulse presence/absence detector has continued for a preset time;

pulse passage controlling means for ignoring a first pulse from said rotary generator after the time lapse signal is received from said timer but passing therethrough a pulse or pulses following the first pulse;

pulse counting means for counting the pulses from said pulse passage controlling means;

memory means for storing therein an output of said pulse counting means; and means for generating a controlling signal in response to data stored in said memory means.

* * * * *